United States Patent [19]

Hanagama et al.

[11] Patent Number: 5,521,516
[45] Date of Patent: May 28, 1996

[54] SEMICONDUCTOR INTEGRATED CIRCUIT FAULT ANALYZING APPARATUS AND METHOD THEREFOR

[75] Inventors: Yasuko Hanagama; Toyokazu Nakamura; Kiyoshi Nikawa; Tohru Tsujide, all of Tokyo, Japan

[73] Assignee: NEC Corporation, Tokyo, Japan

[21] Appl. No.: 354,088

[22] Filed: Dec. 6, 1994

[30] Foreign Application Priority Data

Dec. 8, 1993 [JP] Japan ................................. 5-308245

[51] Int. Cl.[6] ................................................ G01R 1/04
[52] U.S. Cl. ...................... 324/751; 324/72.5; 250/305; 250/310
[58] Field of Search .............................. 324/158.1, 751, 324/73.1, 72.5; 250/305, 310

[56] References Cited

U.S. PATENT DOCUMENTS 5,369,359  11/1994  Schmitt ............................. 324/158.1

OTHER PUBLICATIONS

T. Nakamura et al., "Development of rapid voltage contrast image acquisition technique and its application to LSI fault origin localization", R91–68 CPM 91–135, Mar. 13, 1992, total 8 pages.

T. C. May et al., "Dynamic Fault Imaging of VLSI Random Logic Devices", 1984 IEEE/IRPS, pp. 95–108 (month unavailable).

*Primary Examiner*—Kenneth A. Wieder
*Assistant Examiner*—Barry C. Bowser
*Attorney, Agent, or Firm*—Whitham, Curtis, Whitham & McGinn

[57] ABSTRACT

A semiconductor integrated circuit fault analyzing apparatus includes an electron beam tester and controller. The electron beam tester includes an electron gun assembly for generating a primary electron beam and forms a voltage contrast image on the basis of a detection amount of secondary electrons obtained by irradiating the primary electron beam from the electron gun assembly onto a semiconductor integrated circuit serving as a target to be tested and supplied with a test pattern signal, thereby specifying a faulty circuit portion of the semiconductor integrated circuit using the formed voltage contrast image. The controller sets, immediately before the test pattern signal is supplied to the semiconductor integrated circuit, at least one of a power and a signal which are supplied to the semiconductor integrated circuit to be a voltage different from a voltage obtained in the presence of the test pattern signal to cause the electron beam tester to acquire a voltage contrast image free from charge-up phenomena in synchronism with the start of supplying the test pattern signal.

20 Claims, 6 Drawing Sheets

SEMICONDUCTOR INTEGRATED CIRCUIT FAULT ANALYZING APPARATUS AND METHOD THEREFOR

BACKGROUND OF THE INVENTION

The present invention relates to a fault analyzing apparatus using an electron beam tester for testing a change in voltage of a semiconductor integrated circuit and a method therefor.

When voltage waveform information acquired using an electron beam tester is to be used for analyzing and localizing a fault origin of a semiconductor integrated circuit (to be referred to as a DUT (Device Under Test) hereinafter), the assistance of a designer or design information (to be referred to as CAD data hereinafter) such as CAD (Computer Aided Design) database is disadvantageously required, or the voltage waveform information disadvantageously cannot be used until a fault origin is localized to some extent by another method. At a site at which a fault analysis is to be performed, a designer is not always present, and CAD data cannot always be obtained. In this case, a method of comparing voltage contrast images with each other is proposed as an effective localizing method. This method is called a dynamic fault imaging method (to be referred to as a DFI method) (the first prior art). For example, the method is described as T. C. May et al., "Dynamic Fault Imaging of VLSI Random Logic Devices", 1984 IEEE/IRPS, pp. 95 to 108.

Figure 6A:
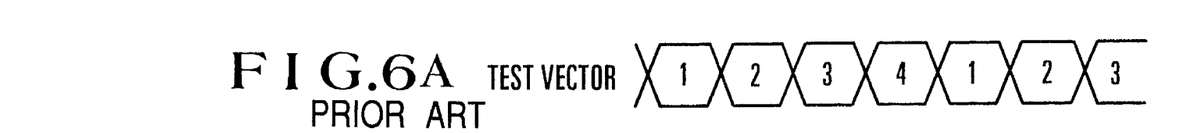
FIGS. 6A to 6C are timing charts of the first prior art using a DFI method.
Figure 6B:
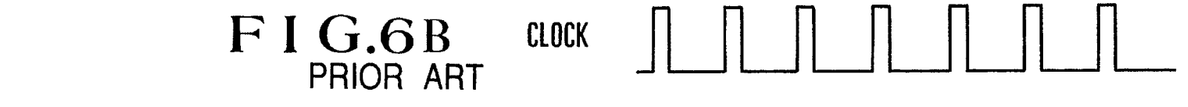
Figure 6C:
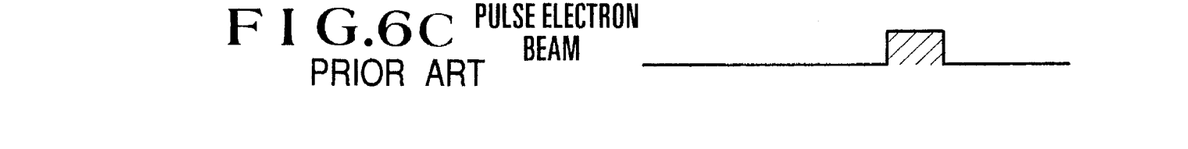

The timing charts of the DFI method are shown in FIGS. 6A to 6C. As shown in FIG. 6A, a test vector is constituted by the repetition of test patterns 1 to 4 from which an image is to be acquired. The test patterns 1 to 4 represent signals for testing a DUT for each clock in FIG. 6B. Only when one specific test pattern is supplied, for example, as shown in FIG. 6C, an electron beam is irradiated as a pulse for 200 ps to 5 µs during only the test pattern 4 period (stroboscopic method). In this manner, this method has the following characteristic feature. That is, while the DUT is driven, the voltage contrast images of the test patterns with respect to faulty and faulty-free integrated circuits are acquired. Portions (faulty images) which are obtained by the difference between the voltage contrast images and which are different from each other in brightness are traced while the test patterns are referred to, thereby localizing a fault origin. However, when the DFI is to be applied, due to the limitation of the sizes (scanning range and magnification) of an electronic optical system, an increase in DUT area, and an increase in wiring density, the voltage contrast images of the entire surface of the DUT cannot be obtained at once at a resolving power which is sufficient to observe the voltages of elements of wiring lines. As a DUT increases in scale, the number of series of test patterns for testing the DUT increases. For this reason, a signal-to-noise ratio of a voltage contrast image decreases, thereby disadvantageously requiring a long time for acquiring an image.

In "Development of rapid voltage contrast image acquisition technique and its application to LSI fault origin localization" (Nakamura, et al., 1992, IEICE technical researching report of the study of Reliability of IEICE, pp. 43 to 48, R91-68 CPM91-1135), Nakamura et al., in order to solve the problem of prolonging a time for acquiring an image, are successful in shortening the time for acquiring the image as a whole on the basis of increase the ratio of a time for acquiring an image signal to the unit time by prolonging the time for inputting, to a DUT, a test pattern designed to acquire the image. This method is called a CGFI method (Continuous e-beam with synchronized Gated signal acquisition Fault Imaging technique), and has a characteristic feature in which a continuous beam is used as an incident electron beam.

Figure 8A:
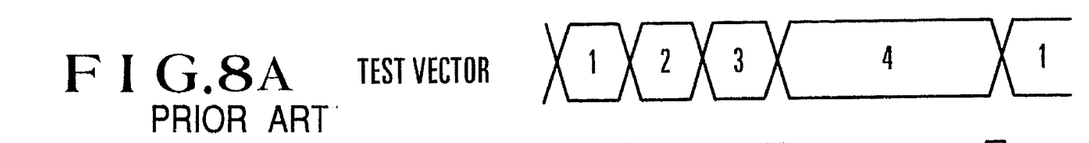
FIGS. 8A to 8D are timing charts of a conventional CGFI method.
Figure 8B:
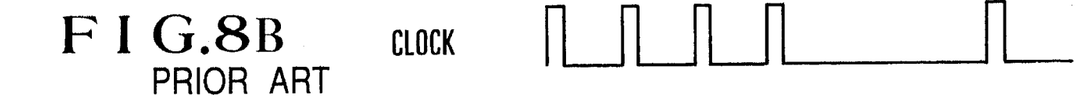
Figure 8C:
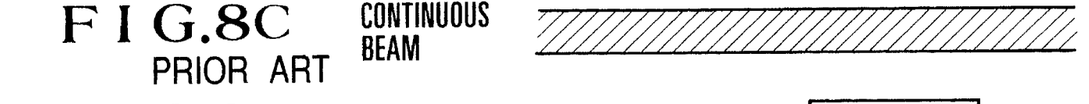
Figure 8D:
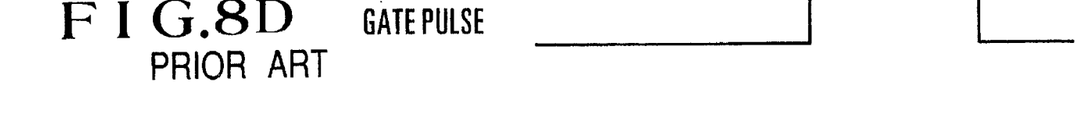

The timing charts of the CGFI method are shown in FIGS. 8A to 8D. As shown in FIG. 8C, secondary electrons are continuously generated by applying a continuous electron beam. However, only when a test pattern from which a voltage contrast image is acquired is supplied by the gate pulse shown in FIG. 8D, e.g., only when the test pattern 4 of the test vector shown in FIG. 8A is supplied, a supply time is prolonged by 50 µs to 1 s, and data obtained during the supply time is received by an image processor to form a voltage contrast image. FIG. 8B shows a clock for switching test patterns.

Figure 7:
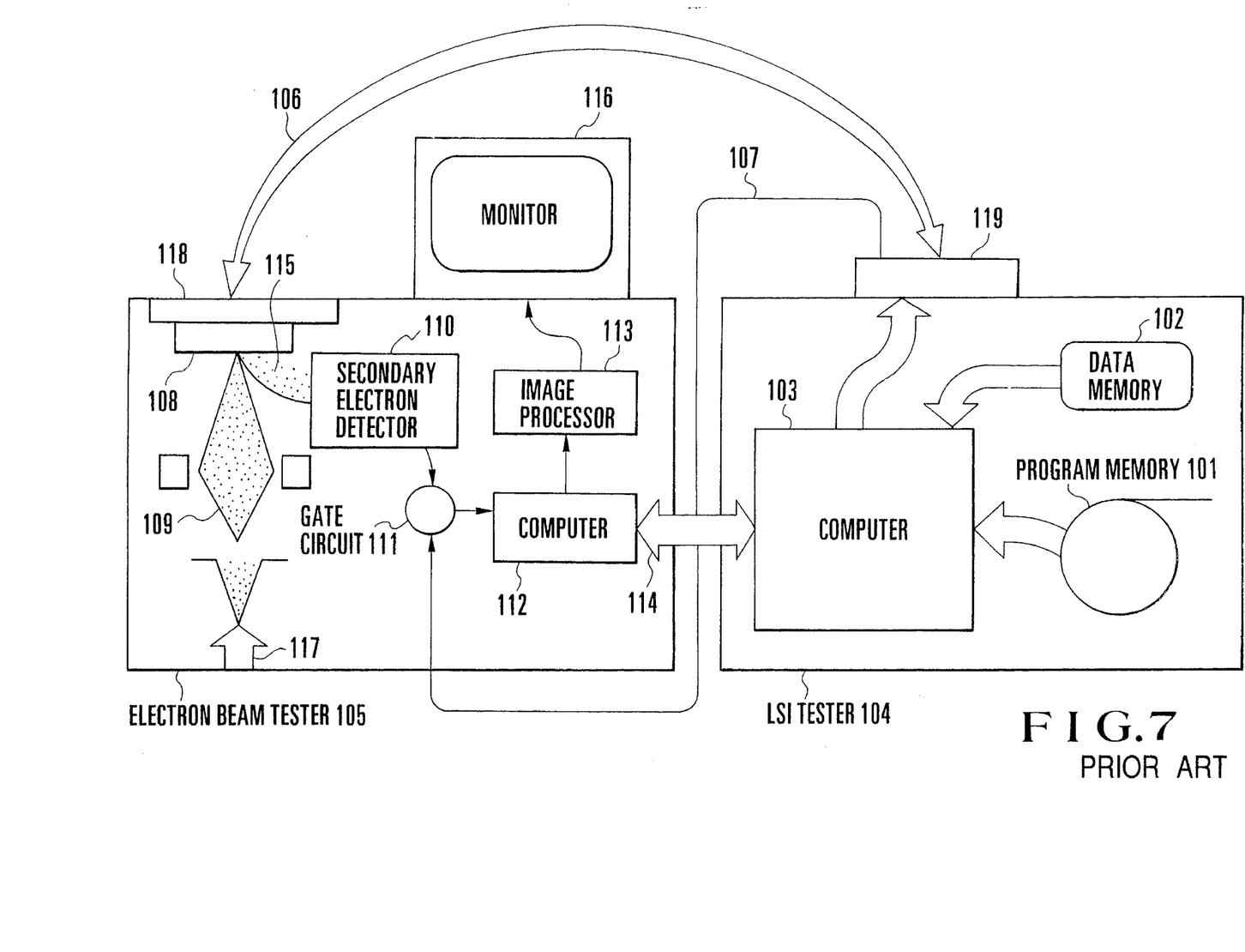
FIG. 7 is a view showing the arrangement of the apparatus according to the second prior art using a CGFI method.

The arrangement of an apparatus for performing the above CGFI method is shown in FIG. 7. Referring to FIG. 7, reference numeral 101 denotes a program memory for storing a control program for performing an LSI test; 102, a data memory for storing test pattern data constituting a test vector; 103, a computer for executing an LSI test in accordance with the control program stored in the program memory 101; 104, an LSI tester; 105, an electron beam tester; 106, a signal line for supplying the test pattern data stored in the data memory 102 to the electron beam tester 105; 107, an image acquiring timing line for transmitting a gate pulse from the LSI tester 104 to the electron beam tester 105; 108, a DUT serving as a target to be tested; 109, an electron beam irradiated on the DUT 108; 110, a secondary electron detector for detecting secondary electrons 115 from the DUT 108; 111, a gate circuit for extracting voltage contrast image data from the secondary electron detector 110 on the basis of the gate pulse of the image timing signal line 107; 112, a computer for receiving the voltage distribution data extracted by the gate circuit 111; 113, an image processor 113 for imaging the voltage contrast image data received by the computer 112; 114, a GPIB (General Purpose Interface Bus) control line for transmitting and receiving a control signal between the computers 103 and 112; 116, a CRT monitor for displaying the voltage contrast image imaged by the image processor 113; 117, an electron gun assembly for generating the electron beam 109; 118, a socket to which the DUT 108 is connected; and 119, a connector of the LSI tester 104.

Nakamura et al., connect the electron beam tester 105 to the LSI tester 104 through the GPIB control line 114 such that a test pattern changing operation performed when these test patterns are referred to, i.e., when an editing operation of the test patterns (change operation of a test pattern to be designated, a setting operation of prolongation of an input time, or a setting operation of a test pattern performed to prevent the test pattern following the designated test pattern from being input to the DUT 108) is automatically performed. In this manner, by using a voltage contrast image formed on the basis of the detection amount of the secondary electrons 115 obtained by irradiating the electron beam 109 from the electron gun assembly 117 onto the DUT 108, in a system for specifying a faulty circuit portion of the DUT 108, as described in FIGS. 8A to 8D, Nakamura et al., acquire a voltage contrast image such that a time for inputting, to an integrated circuit, a test pattern, of a series of test patterns repeatedly input to the integrated circuit, designated to acquire a voltage contrast image is set to be longer than a time for inputting each of the remaining test patterns, thereby acquiring an image at a high speed (the second prior art).

However, in the second prior art, when an electron beam is to be irradiated on an LSI chip with an insulating film, the levels of test patterns may be deviated to high or low, or a voltage contrast may decrease due to the influence of a charge-up phenomenon when a fixed voltage fault occurs. Therefore, a voltage level cannot easily be determined from a voltage image.

SUMMARY OF THE INVENTION

It is an object of the present invention to provide a semiconductor integrated circuit fault analyzing apparatus and method for automatically analyzing a fault to increase an operation speed.

It is another object of the present invention to provide a semiconductor integrated circuit fault analyzing apparatus and method in which the influence of a charge-up phenomenon caused by a CDFI method is reduced.

In order to achieve the above objects of the present invention, there is provided a semiconductor integrated circuit fault analyzing apparatus comprising an electron beam tester, including an electron gun assembly for generating a primary electron beam, for forming a voltage contrast image on the basis of a detection amount of secondary electrons obtained by irradiating the primary electron beam from the electron gun assembly onto a semiconductor integrated circuit serving as a target to be tested and supplied with a test pattern signal, thereby specifying a faulty circuit portion of the semiconductor integrated circuit using the formed voltage contrast image, and control means for setting, immediately before the test pattern signal is supplied to the semiconductor integrated circuit, at least one of a power and a signal which are supplied to the semiconductor integrated circuit to be a voltage different from a voltage obtained in the presence of the test pattern signal to cause the electron beam tester to acquire a voltage contrast image free from charge-up phenomena in synchronism with the start of supplying the test pattern signal.

DESCRIPTION OF THE PREFERRED EMBODIMENTS

Embodiments of the present invention will be described below with reference to the accompanying drawing.

Figure 1:
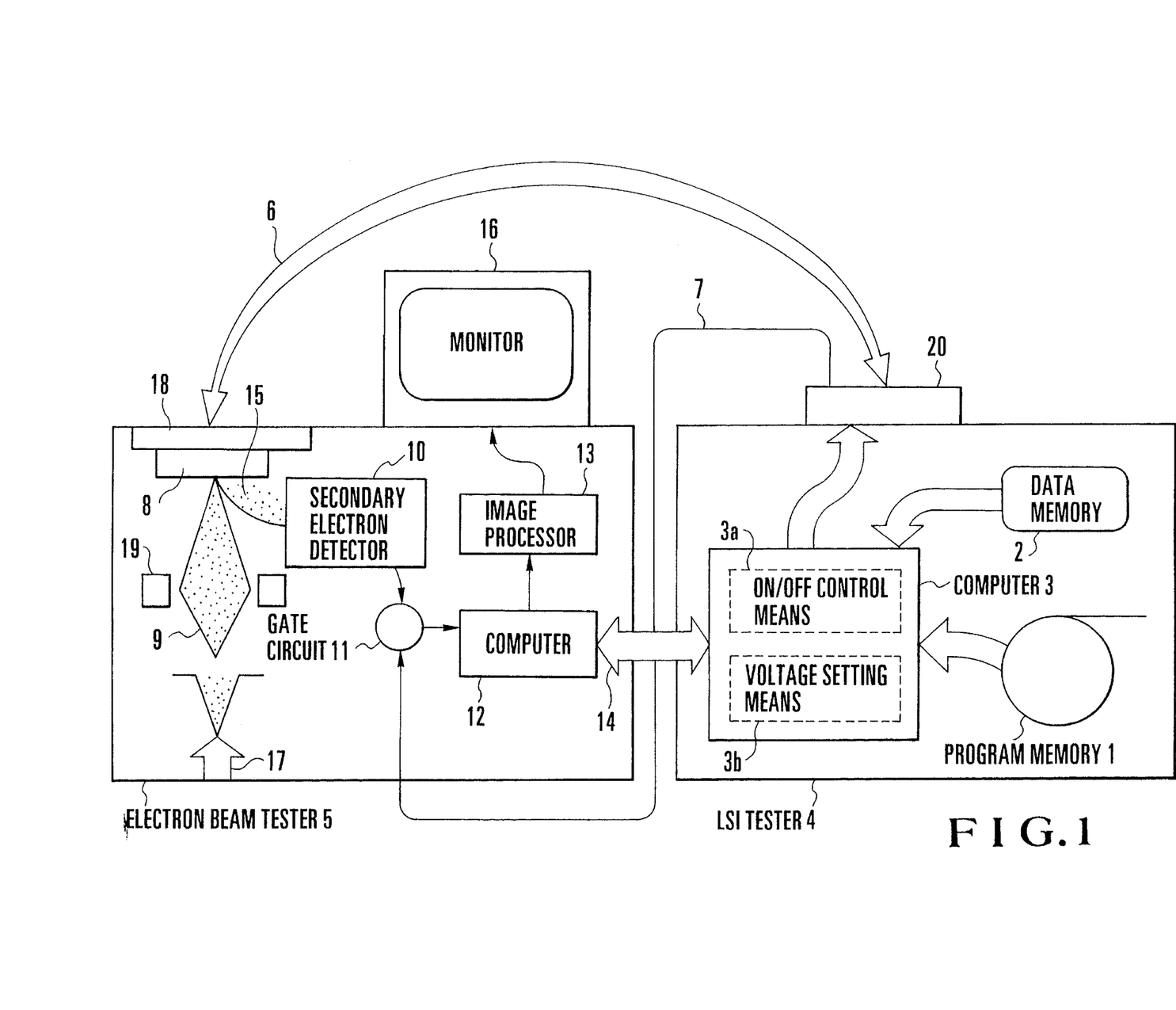
FIG. 1 is a view showing the arrangement of a semiconductor integrated circuit fault analyzing apparatus according to the present invention.

FIG. 1 shows the arrangement of an apparatus according to the first embodiment of the present invention. According to the first embodiment, a novel control program is added to the control program stored in the program memory 101 of the second prior art, and a means for ON/OFF-controlling a power supply (signal) and a means for setting the voltage of the power supply (signal) during an OFF period are further arranged on the computer 103 of the second prior art. The first embodiment will be described below with reference to FIG. 1. Reference numeral 4 denotes an LSI tester for a LSI test. The LSI tester 4 is constituted by a program memory 1 for storing a control program including a power supply (signal) control program for executing an LSI test, a data memory 2 for storing test pattern data constituting a test vector, a computer 3, including an ON/OFF control means 3a for ON/OFF-controlling the power supply (signal) and a voltage setting means 3b for setting a power supply (signal) voltage during an OFF period, for performing an LSI test including an ON/OFF control operation and a voltage setting operation on the basis of the control program stored in the program memory 1, and a connector 20.

Reference numeral 5 denotes an electron beam tester electrically connected to the LSI tester 4. The electron beam tester 5 is constituted by a secondary electron detector 10 for detecting secondary electrons 15 from a DUT 8, a gate circuit 11 for extracting voltage contrast image data from the secondary electron detector 10 on the basis of a gate pulse from the LSI tester 4, a computer 12 for receiving the voltage contrast image data extracted by the gate circuit 11, a image processor 13 for imaging the voltage contrast image data received by the computer 12, an electron monitor 16 for displaying the voltage contrast image imaged by the image processor 13, an electron gun assembly 17 for irradiating an electron beam 9 on the DUT 8 serving as a device to be tested, a socket 18 to which the DUT 8 is connected, and a condenser lens 19 for controlling the current amount of the incident electron beam.

The computer 3 of the LSI tester 4 is connected to the computer 12 of the electron beam tester 5 through a GPIB control line 14 for transmitting and receiving a control signal. The connector 20 of the LSI tester 4 is connected to the socket 18 of the electron beam tester 5 through a signal line 6, and test pattern data stored in the data memory 2 and read out by the computer 3 is supplied to the DUT 8 through the signal line 6. The DUT 8 is supplied with the test pattern from the LSI tester 4 and a power supply voltage through the signal line 6, and the computer 3 of the LSI tester 4 controls the levels of the signal and power supply voltage applied to the DUT 8 through the signal line 6. Reference numeral 7 denotes an image acquiring timing line for transmitting a gate pulse from the LSI tester 4 to the gate circuit 11 of the electron beam tester 5.

Figure 9A:
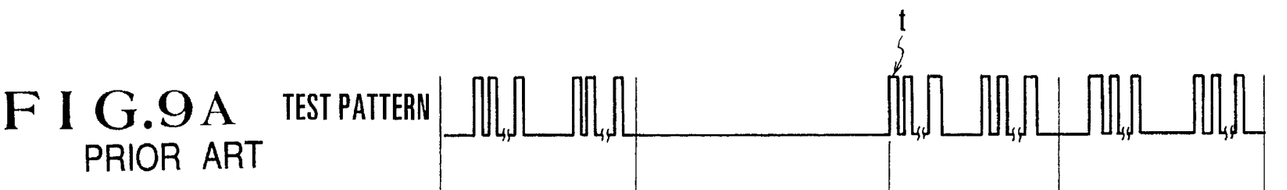
FIGS. 9A and 9B are timing charts of a conventional CGFI method.
Figure 9B:
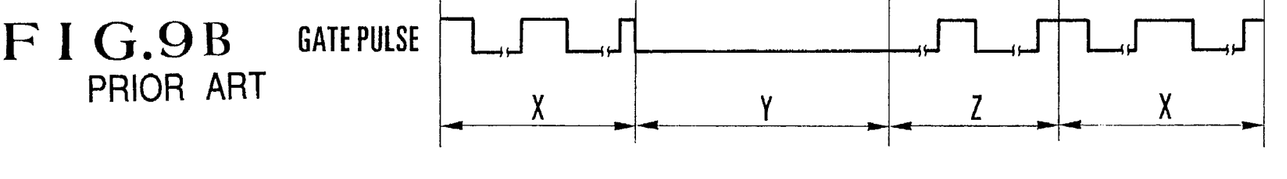

In a conventional CGFI method, as shown in FIGS. 9A and 9B, after a voltage contrast image is acquired in period X (1 second), a power supply for a DUT 108 is set in an OFF state during period Y (20 to 30 seconds), and the test pattern of an LSI tester 104 is changed. While the power supply is set in an OFF state, the test pattern shown in FIG. 9A and the gate pulse shown in FIG. 9B are set in an OFF state. At time t, the power supply is turned on, a test to be performed by the LSI tester 104 is started, and a state wherein the test pattern is input to the DUT 108 through the signal line 107 and a socket 118 is set. Thereafter, a voltage contrast image is acquired by an electron beam tester 105 in period X after period Z (2 to 3 seconds) has elapsed.

Figure 2:
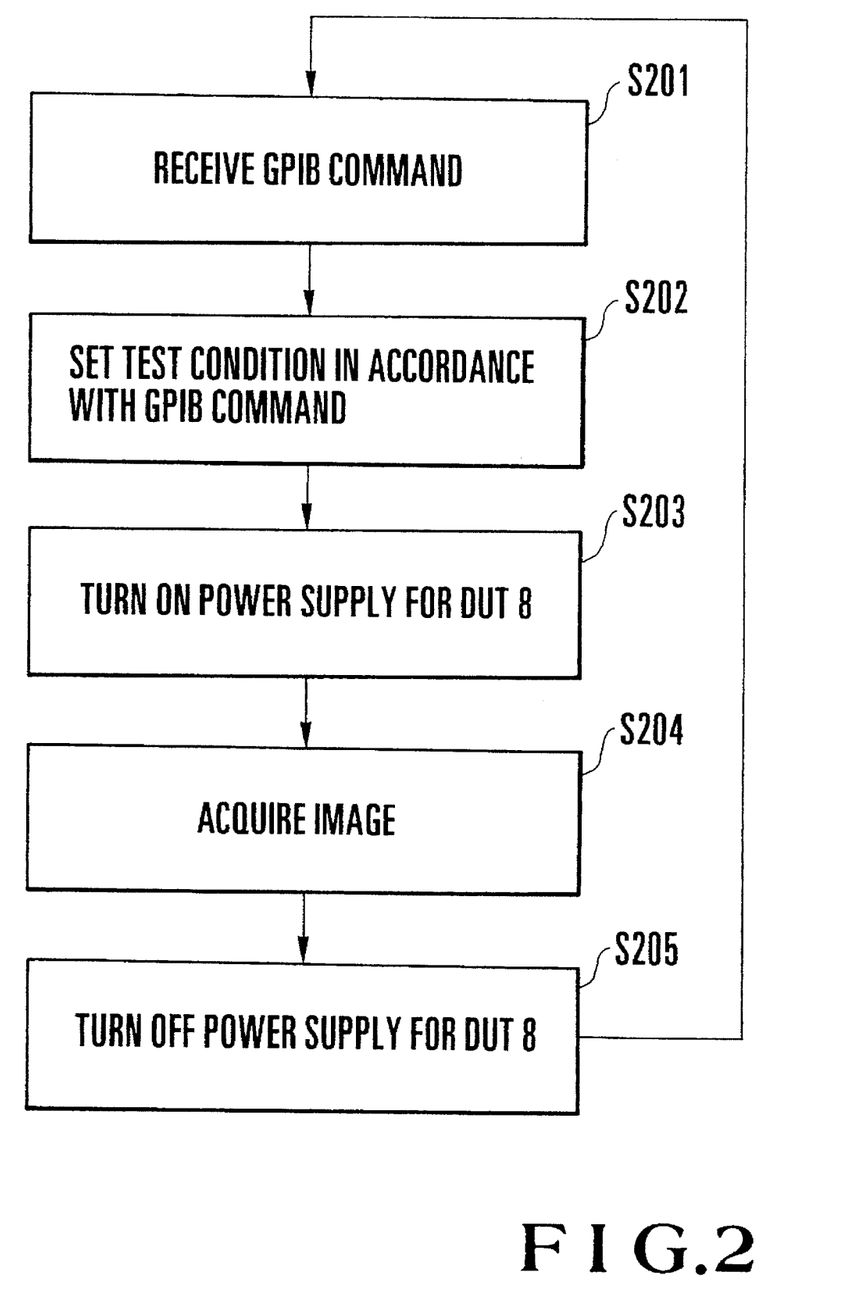
FIG. 2 is a flow chart showing the schematic operation of the fault analyzing apparatus in FIG. 1.

According to the present invention, the electron beam tester 5 and the LSI tester 4 are connected to each other through the control line 14, novel steps S203 and S205 shown in FIG. 2 area added to the program memory 1, thereby ON/OFF-controlling the power supply for the DUT 8. More specifically, in FIG. 2, when the computer 3 of the LSI tester 4 receives a GPIB command from the computer 12 of the electron beam tester 5 through the control line 14 (step S201), the computer 3 sets test conditions including an automatic change in test pattern in accordance with the GPIB command (step S202). In addition, at this time, the voltage setting means 3b sets the voltage of a power supply including a signal line (to be described later). Upon completion of setting the conditions, the ON/OFF control means 3a turns on the power supply for the DUT 8 (step S204), and a designated test pattern is applied for a prolonged time to acquire a voltage contrast image (step S204). Thereafter, the power supply for the DUT 108 is turned off (step S205). In this manner, an ON/OFF control operation and an image acquiring operation can be synchronized with each other within several tens milliseconds or less.

Figures 3A, 3B:
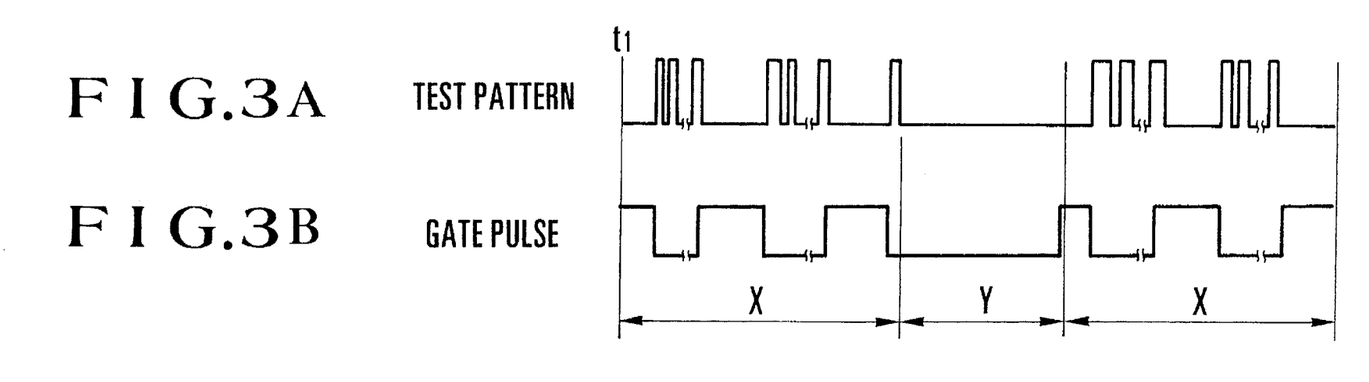
FIGS. 3A and 3B are timing charts of an image acquiring operation performed by an automatic signal ON-OFF method according to the present invention.
Figure 4A:
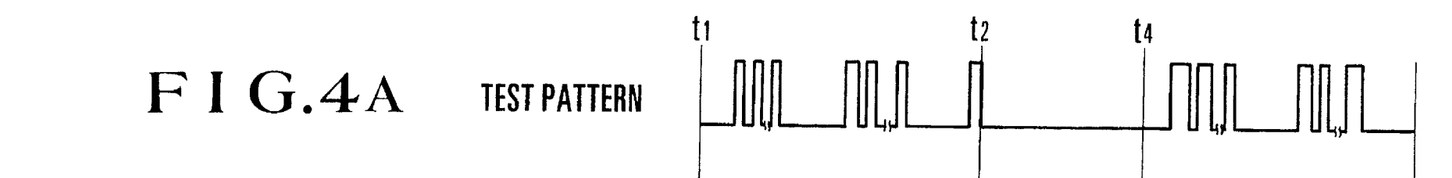
FIGS. 4A, 4B, and 4C are timing charts of an image acquiring operation performed by an automatic power supply ON-OFF method according to the present invention.
Figures 4B, 4C:
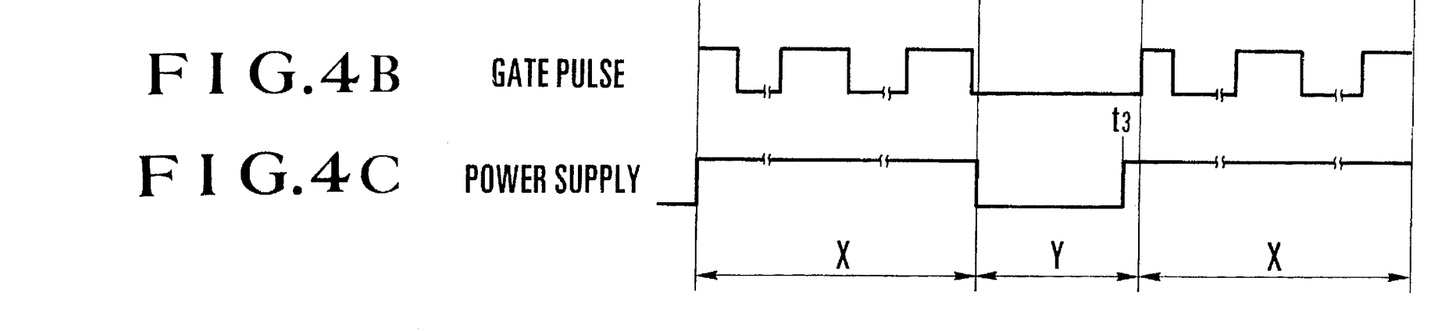

The timing charts of an image acquiring operation according to the present invention are shown in FIGS. 3A, 3B, 4A, 4B, and 4C. In the present invention, a method of turning off only the signal voltages shown in FIGS. 3A and 3B is called an automatic signal ON-OFF method, and a method of turning off all the voltages of the power supply including a signal voltage shown in FIGS. 4A, 4B, and 4C is called an automatic power supply ON-OFF method. In this case, in FIGS. 3A and 3B, a signal is automatically turned off after an image is acquired in period X (0.5 seconds), and, in period Y (5 to 6 seconds) in which the signal is set in an OFF state, the signal voltage of the test pattern shown in FIG. 3A is set to be an intermediate voltage between high level and low level obtained in the presence of a test pattern, or set at either high or low level. In this case, referring to FIGS. 3A and 3B, the signal is automatically turned off after the image is acquired during period X, and, immediately after the end of period Y (5 to 6 seconds) in which the signal is set in an OFF state, the signal voltage of the test pattern shown in FIG. 3A is set to be an intermediate voltage between high level and low level in the presence of a test pattern, or set at either high or low level. The timing of this setting will be described below in detail with reference to FIGS. 4A to 4C. Referring to FIG. 4A, the power supply including the signal is automatically turned off at timing t2 after the image is acquired during period X (0.5 seconds), and all the voltages of the power supply line and a ground line are set to be an intermediate voltage between high level and low level in the presence of a test pattern, or set at either high or low level for 200 to 300 ms at the end of period Y (5 to 6 seconds) in which the power supply is set in an OFF state, i.e., at timing t3, shown in FIGS. 4C, immediately before the image is acquired. The power supply is controlled to be set at a predetermined voltage and is turned on at timing t4 shown in FIG. 4A, and application of a test pattern is started. Immediately after the start of this application, an image is acquired during period X (0.5 seconds). On the other hand, a gate pulse is set in an OFF state during period Y.

In addition, in the CGFI method, a ratio of a portion having an extended test pattern from which an image is to be acquired to an entire test vector is defined as a duty ratio, and the duty ratio is set to be 0.1 in the conventional CGFI method. The method, shown in FIGS. 3A, 3B, 4A, 4B, and 4C, according to the present invention, the duty ratio was increased to 0.9, and a time for acquiring an image was set to be 0.5 seconds, and a voltage image (0.5 seconds) having a small transient influence of a charge-up phenomenon could be acquired using the CGFI method of the first embodiment.

Figure 5A:
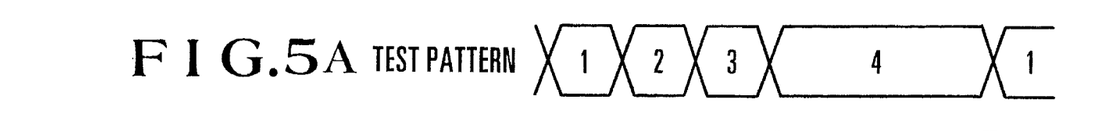
FIGS. 5A to 5D are timing charts obtained when the present invention is applied to a pulse electron beam.
Figure 5B:
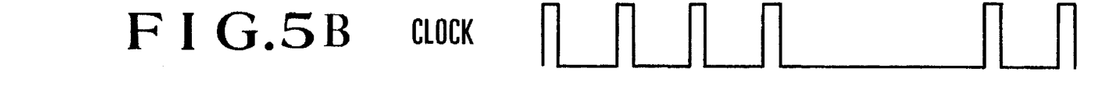
Figure 5C:
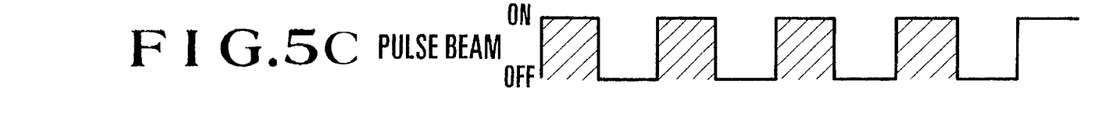
Figure 5D:
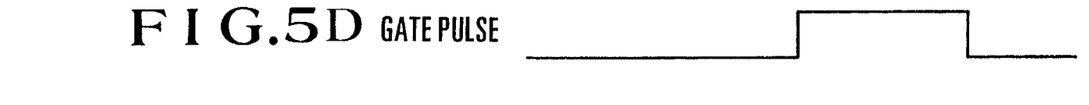

The second embodiment obtained of using a method of reducing a beam current amount in the first embodiment will be described below. The filament current of an electron gun assembly 17 of an electron beam tester 5 is changed by a computer 12 to reduce the beam current amount to 0.1 nA which is 1/7 a beam current amount (0.7 nA) obtained when the electron gun assembly 17 is generally used. An image is acquired by the same method as in the first embodiment. When an incident electron beam is changed into a repetition pulse electron beam out of phase with a period for supplying a test pattern, the beam current can be reduced. In contrast to the CGFI method using a continuous beam, a method of changing an electron beam into a pulse beam is called a PGFI method (Pulse e-beam With Synchronized Gated Signal Acquisition Fault Imaging Technique). Timing charts of an image acquiring operation performed using a pulse electron beam are shown in FIGS. 5A to 5D. Referring to FIGS. 5A to 5D, the test pattern shown in FIG. 5A is switched by the clock shown in FIG. 5B to extend a test pattern 4 designated to acquire an image. The pulse beam shown in FIG. 5C is irradiated on the DUT 8, the gate pulse shown in FIG. 5D is transmitted to an electron monitor 16 in accordance with the extended test pattern 4, thereby acquiring the voltage contrast image of the test pattern 4.

In addition to the first embodiment, a current amount of the incident electron beam is changed under the current control of a condenser lens 19 of an electron beam tester 4 in accordance with a change in magnification of a voltage image. An image is acquired by the same method as in the first embodiment.

Control for pulse irradiation and continuous irradiation performed by the electron gun assembly 17, filament current control for the electron gun assembly 17, and current control for the condenser lens 19 are performed by the computer 12.

In addition, in period Y, although the voltages of a signal line, a power supply line, and a ground line are set at predetermined voltages, respectively, the voltages may be set in combinations of high level and low level.

According to the present invention, even when the voltage of a test pattern signal is deviated to high level or low level, an image is automatically acquired in synchronism with an input operation of the test pattern signal by the automatic signal ON-OFF method or the automatic power supply ON-OFF method. For this reason, the image can be acquired in a transient period before a charge-up phenomenon progresses. Similarly, when a voltage is fixed, in a conventional CGFI method, a voltage image having a low voltage contrast is obtained due to a charge-up phenomenon. However, according to the present invention, even when a voltage is fixed, a voltage image having a high voltage contrast can be obtained. In addition, a method of reducing a beam current amount is used, the influence of a charge-up phenomenon can be reduced. The influence of the charge-up phenomenon increases as the magnification of an image increases. For this reason, when the current amount of an incident electron beam changes in accordance with a change in magnification of a voltage contrast image, the influence of a charge-up phenomenon can be reduced in a voltage image having a high magnification.

What is claimed is:

1. A semiconductor integrated circuit fault analyzing apparatus comprising:

an electron beam tester, including an electron gun assembly for generating a primary electron beam, for forming a voltage contrast image on the basis of a detection amount of secondary electrons obtained by irradiating the primary electron beam from said electron gun assembly onto a semiconductor integrated circuit serving as a target to be tested and supplied with a test pattern signal, thereby specifying a faulty circuit portion of said semiconductor integrated circuit using the voltage contrast image; and control means for setting, immediately before the test pattern signal is supplied to said semiconductor integrated circuit, at least one of a power and a signal which are supplied to said semiconductor integrated circuit such that said semiconductor integrated circuit has a first voltage different from a second voltage obtained during a period when the test pattern signal is supplied, so as to cause said electron beam tester to acquire said voltage contrast image free of a charge-up phenomena in synchronism with a start of supplying the test pattern signal, wherein said control means comprises ON/OFF control means for automatically controlling an ON period and an OFF period of said at least one of said power and said signal which are supplied to said semiconductor integrated circuit in accordance with a change in said test pattern signal, and voltage setting means for automatically setting, at a predetermined voltage, said at least one of said power and said signal which are supplied to said semiconductor integrated circuit during said OFF period set by said ON/OFF control means.

2. An apparatus according to claim 1, further comprising beam tester control means for controlling said electron gun assembly to decrease a beam current amount.

3. An apparatus according to claim 1, further comprising beam tester control means for controlling said electron gun assembly to continuously irradiate an electron beam.

4. An apparatus according to claim 1, further comprising beam tester control means for controlling said electron gun assembly to irradiate an electron beam as a repetition pulse electron beam, a second period of said electron beam being asynchronous with said period of supplying the test pattern signal.

5. An apparatus according to claim 1, further comprising a condenser lens for electrically changing a magnification of the voltage contrast image, and beam tester control means for controlling a beam current amount of said voltage assembly in accordance with the magnification of the voltage contrast image.

6. An apparatus according to claim 1, wherein said control means sets, in the absence of a test pattern signal, at least one of a signal voltage, voltages of a power supply line and a ground line to be an intermediate voltage between a high level voltage and a low level voltage, said high level voltage and said low level voltage being obtained during said period when the test pattern signal is supplied.

7. An apparatus according to claim 1, wherein said control means sets, in the absence of a test pattern signal, at least one of a signal voltage, voltages of a power supply line and a ground line at one of a high level voltage and a low level voltage, said high level voltage and said low level voltage being obtained during said period when the test pattern signal is supplied.

8. An apparatus according to claim 1, wherein said control means sets, in the absence of a test pattern signal, a signal voltage, voltages of a power supply line and a ground line in a predetermined combination of a high level voltage and a low level voltage, said high level voltage and said low level voltage being obtained during said period when the test pattern signal is supplied.

9. An apparatus according to claim 1, further comprising:

beam tester control means, arranged in said electron beam tester, for controlling formation of said voltage contrast image;

a large scale integrated circuit (LSI) tester including said control means;

a control line for connecting said control means of said LSI tester to said beam tester control means of said electron beam tester; and a signal line for supplying a power supply voltage and a test pattern signal to said semiconductor integrated circuit attached to said electron beam tester.

10. A method of analyzing a semiconductor integrated circuit fault, comprising steps of:

setting at least one of a power and a signal supplied to a semiconductor integrated circuit at a first voltage different from a second voltage obtained during a period when the test pattern signal is supplied;

supplying a test pattern to said semiconductor integrated circuit;

irradiating a primary electron beam on said semiconductor integrated circuit supplied with the test pattern;

forming a voltage contrast image free of a charge-up phenomena on the basis of secondary electrons obtained, in synchronism with a start of said step of supplying the test pattern, from said semiconductor integrated circuit on which a primary electron beam is irradiated;

specifying a faulty circuit portion of said semiconductor integrated circuit using a formed voltage contrast image; and turning on or off at least one of a power and a signal before and after the period when said test pattern signal is supplied, wherein the step of setting comprises a step of setting at least one of a power and a signal which arc supplied to said semiconductor integrated circuit during a process of changing the test pattern signal to said first voltage.

11. A method according to claim 10, wherein the step of setting comprises a step of setting at least one of a signal voltage, voltages of a power supply line and a ground line to be an intermediate voltage between a high level voltage and a low level voltage, said high level voltage and said low level voltage being obtained during said period when the test pattern signal is supplied.

12. A method according to claim 10, wherein the step of setting comprises a step of setting at least one of a signal voltage, voltages of a power supply line and a ground line to be one of a high-level voltage and a low-level voltage, said high level voltage and said low level voltage being obtained during said period when the test pattern signal is supplied.

13. A semiconductor integrated circuit fault analyzing apparatus comprising:

an electron beam tester, including an electron gun assembly for generating a primary electron beam, for forming a voltage contrast image on the basis of a detection amount of secondary electrons obtained by irradiating the primary electron beam from said electron gun assembly onto a semiconductor integrated circuit serving as a target to be tested and supplied with a test pattern signal, thereby specifying a faulty circuit portion of said semiconductor integrated circuit using the voltage contrast image; and a large scale integrated circuit (LSI) tester including control means, said control means for setting, immediately before the test pattern signal is supplied to said semiconductor integrated circuit, at least one of a power and a signal which are supplied to said semiconductor integrated circuit such that said semiconductor integrated circuit has a first voltage different from a second voltage obtained during a period when the test pattern signal is supplied, so as to cause said electron beam tester to acquire said voltage contrast image free of a charge-up phenomena in synchronism with a start of supplying the test pattern signal;

beam tester control means, arranged in said electron beam tester, for controlling formation of said voltage contrast image and for controlling said electron gun assembly to decrease a beam current amount;

a control line for connecting said control means of said LSI tester to said beam tester control means of said electron beam tester; and a signal line for supplying a power supply voltage and a test pattern signal to said semiconductor integrated circuit attached to said electron beam tester, wherein said control means sets, in the absence of a test pattern signal, a signal voltage, voltages of a power supply line and a ground line at one of a high level voltage and a low level voltage, said high level voltage and said low level voltage being obtained during said period when the test pattern signal is supplied.

14. An apparatus as in claim 1, wherein said voltage constant image is acquired by said electron beam tester within 0.1 second after a start of said ON period.

15. An apparatus as in claim 1, wherein a duty ratio of said apparatus is 0.9.

16. An apparatus as in claim 15, wherein said duty ratio comprises a ratio of a test pattern of said test pattern signal to said test pattern signal.

17. An apparatus as in claim 1, wherein said voltage contrast image is acquired within 0.5 seconds after said test pattern is supplied.

18. An apparatus as in claim 2, wherein said beam current includes a current within a current range of 0.7 nA to 0.1 nA.

19. An apparatus as in claim 1, wherein said electron gun assembly generates a pulsed electron beam of said primary electron beam.

20. An apparatus as in claim 1, further comprising a condenser lens for controlling a magnification of said primary electron beam.

* * * * *